(12) United States Patent
Lin et al.

(10) Patent No.: US 9,513,512 B2
(45) Date of Patent: Dec. 6, 2016

(54) METHOD FOR PRODUCING MASTERBOARD ALIGNMENT FILM AND TRANSFER PRINTING PLATE AND ALIGNMENT SOLUTION

(71) Applicant: BEIJING BOE OPTOELECTRONICS TECHNOLOGY CO., LTD., Beijing (CN)

(72) Inventors: Haiyun Lin, Beijing (CN); Chengtan Zhao, Beijing (CN); Hui Li, Beijing (CN); Jingpeng Li, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 13/823,312

(22) PCT Filed: Sep. 28, 2012

(86) PCT No.: PCT/CN2012/082374
§ 371 (c)(1),
(2) Date: Mar. 14, 2013

(87) PCT Pub. No.: WO2013/185422
PCT Pub. Date: Dec. 19, 2013

(65) Prior Publication Data
US 2014/0057200 A1  Feb. 27, 2014

(30) Foreign Application Priority Data

Jun. 14, 2012  (CN) .......................... 2012 1 0199221

(51) Int. Cl.
*G02F 1/1337* (2006.01)
*G03F 7/16* (2006.01)
(Continued)

(52) U.S. Cl.
CPC .......... *G02F 1/133788* (2013.01); *G03F 7/022* (2013.01); *G03F 7/0233* (2013.01); *G03F 7/16* (2013.01); *G02F 2001/133388* (2013.01)

(58) Field of Classification Search
CPC ................... G02F 1/133711; G02F 1/133723; G02F 1/13378; G02F 1/133784; G02F 1/133788; G02F 1/1337; G03F 7/0005; G03F 7/16; G03F 7/022; G03F 7/0233
(Continued)

(56) References Cited

U.S. PATENT DOCUMENTS 5,866,294 A * 2/1999 Oguni et al. .................. 430/166
2005/0126410 A1* 6/2005 Won et al. .................... 101/359
(Continued)

FOREIGN PATENT DOCUMENTS

| CN | 1343755 A | 4/2002 |
|---|---|---|
| CN | 1175082 C | 11/2004 |

(Continued)

OTHER PUBLICATIONS

Computer-generated translation of JP 2000-111921 (Apr. 2000).*
(Continued)

*Primary Examiner* — John A McPherson
(74) *Attorney, Agent, or Firm* — Ladas & Parry LLP

(57) ABSTRACT

Embodiments of the present invention disclose a method for producing a masterboard alignment film, and a transfer printing plate and an alignment solution. The method comprises coating the alignment solution on a masterboard having two or more substrates using the transfer printing plate which has a transfer region simultaneously covering the two or more substrates, so that the alignment solution forms an alignment film on the masterboard; and removing the alignment film on the masterboard which is located in regions that are out of the display regions of the substrates (Continued)

and where there is no need to retain the alignment film. This method can solve the existing display defect issues that are caused by too thick peripheral regions of the alignment film, and the overlapping of the too thick peripheral regions of the alignment film with the sealant region.

6 Claims, 3 Drawing Sheets

(51) Int. Cl.
      *G03F 7/022*       (2006.01)
      *G03F 7/023*       (2006.01)
      *G02F 1/1333*     (2006.01)

(58) Field of Classification Search
      USPC . 430/320, 321, 326; 349/124, 126; 427/162, 427/164, 165, 553
      See application file for complete search history.

(56) References Cited

U.S. PATENT DOCUMENTS

| | | | |
|---|---|---|---|
| 2007/0042136 A1* | 2/2007 | Ju et al. | 428/1.2 |
| 2008/0043175 A1 | 2/2008 | Jeong et al. | |

FOREIGN PATENT DOCUMENTS

| | | | |
|---|---|---|---|
| CN | 101097334 A | | 1/2008 |
| CN | 101633780 A | | 1/2010 |
| JP | 2000-111921 A | * | 4/2000 |
| JP | 2001-343649 A | * | 12/2001 |
| JP | 2005-141235 A | | 6/2005 |
| JP | 2005-157240 A | | 6/2005 |
| JP | 2005-338422 A | | 12/2005 |
| JP | 2008-156393 A | | 7/2008 |
| KR | 20080002418 A | | 1/2008 |
| KR | 20100053648 A | | 5/2010 |
| WO | 2009041708 A1 | | 4/2009 |
| WO | 2011/059089 A1 | | 5/2011 |

OTHER PUBLICATIONS

Computer-generated translation of JP 2001-343649 (Dec. 2001).*
Korea Office Action dated Apr. 25, 2014; Appln. No. 10-2013-7009812.
First Chinese Office Action dated May 4, 2014; Appln. No. 201210199221.7.
Korean Examination Opinion dated Oct. 28, 2014; Appln. No. 10-2013-7009812.
International Preliminary Report on Patentability dated Dec. 16, 2014; PCT/CN2012/082374.
Korean Office Action Appln. No. 10-2013-7009812; Dated Dec. 10, 2014.
Korean Notification of the Examination Opinions dated Mar. 5, 2015; Appln. No. 10-2013-7009812.
Extended European Search Report dated Jun. 19, 2015; Appln. No. 12829171.3-1560/2781955 PCT/CN2012082374.
Japanese Office Action dated Aug. 15, 2016; Appln. No. 2015-516410.

* cited by examiner

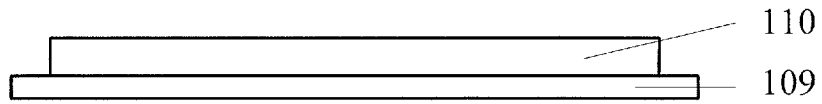

FIG. 4

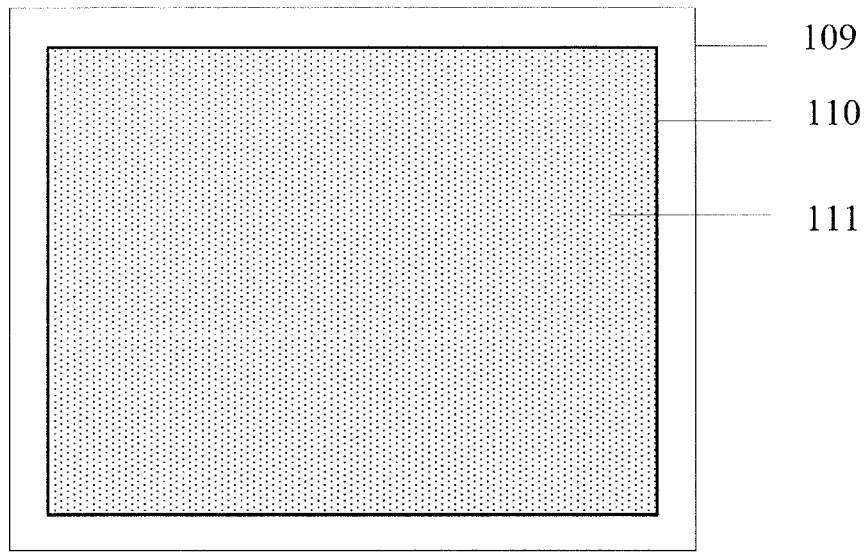

FIG. 5

Step 602: coating an alignment solution on a masterboard having two or more substrates using a transfer printing plate which has a transfer region simultaneously covering the two or more substrates Step 603: removing the alignment film that is located in regions that are out of the display region of the substrates and where there is no need to retain the alignment film on the masterboard.

FIG. 6

METHOD FOR PRODUCING MASTERBOARD ALIGNMENT FILM AND TRANSFER PRINTING PLATE AND ALIGNMENT SOLUTION

TECHNICAL FIELD

Embodiments of the present invention relate to a method for producing a masterboard alignment film, and a transfer printing plate and an alignment solution.

BACKGROUND

Currently, thin film transistor liquid crystal displays (TFT-LCDs) have become a mainstream display product. A TFT-LCD primarily comprises a color filter substrate and an array substrate disposed opposing to each other, with liquid crystals filled in between the color filter substrate and the array substrate. In order to correctly orient the liquid crystal molecules, a layer of alignment solution is coated on the surfaces of the array substrate and the color filter substrate, respectively. A layer of alignment film forms on the array substrate and the color filter substrate from the alignment solution. Subsequently, the alignment films on the array substrate and the color filter substrate are rubbed with a rubbing cloth. By rubbing, microscopic grooves are formed on the surface of the alignment films so that the liquid crystal molecules are initially arranged regularly along the alignment of the grooves.

In a conventional process for the array substrate and the color filter substrate, the alignment solution is generally coated simultaneously on more than two substrates (array substrates or color filter substrates) in a same masterboard, and finally the masterboard is divided to yield single array substrates or color filter substrates.

The device for coating an alignment solution is, e.g., shown in FIG. 1. First, the alignment solution 101 is added dropwise via a dispenser 102 to the contacting position between an anilox roll 103 and a blade roll 104; the alignment solution 101 on the anilox roll 103, which is rotating, is spread uniformly by the blade roll 104; the anilox roll 103 is brought to contact with the transfer printing plate 105 having a preformed pattern, transferring the alignment solution onto the transfer printing plate 105; and finally, the alignment solution 101 is printed onto the surface of the masterboard 107 on the base 106 by the transfer printing plate 105 which is rotating, so as to form the alignment film 108. The diagrammatic schematic view of the lateral expansion of the existing transfer printing plate is shown in FIG. 2, and its planar diagrammatic schematic view is shown in FIG. 3. The transfer printing plate 105 comprises a basal membrane 109 and a transfer layer 110. There are more than two convex transfer regions 111 that correspond to substrates in the masterboard, respectively, and non-transfer regions 112 disposed between transfer regions 111 in the transfer layer 110.

For the aforementioned device for coating an alignment solution, because the individual transfer regions 111 correspond to the individual substrates in the masterboard 107, and the alignment solution 101 tends to accumulate in the peripheral region of the individual transfer regions 111, the alignment solution 101 accumulated in the peripheral region tend to be further transferred to the display region of the substrate, causing the uneven nature of the alignment film 108 on the substrate and resulting in an uneven or too thick peripheral region (halo) of the alignment film 108. This renders the liquid crystal molecules in the peripheral regions of the finally prepared products unable to be oriented normally, causing the shrinking of the display area of the substrate that can function normally. In addition, the aforementioned transfer printing plate 105 is prone to issues of deviational printing of the alignment film 108, further causing the shrinking of the display area of the substrate that can function normally.

SUMMARY

Embodiments of the invention provide a method for producing a masterboard alignment film, and a transfer printing plate and alignment solution, which can solve the existing display defect issues that are caused by too thick peripheral regions of the alignment film, and the overlapping of the too thick peripheral regions of the alignment film with the sealant region.

One aspect of the present invention provides a method for producing a masterboard alignment film comprising coating an alignment solution on a masterboard having two or more substrates using a transfer printing plate which has a transfer region simultaneously covering the two or more substrates, so that the alignment solution forms an alignment film on the masterboard; and removing the alignment film on the masterboard which is located in regions that are out of the display regions of the substrates and where there is no need to retain the alignment film.

In the aforementioned method, for example, said alignment film consists of a light processing material; and when said alignment film is removed, an exposure process is conducted using a mask plate followed by a developing process.

In the aforementioned method, for example, said alignment solution comprises a liquid crystal molecule alignment material, a photosensitive material, a photosensitizer and a solvent, or for example, consists of a liquid crystal molecule alignment material, a photosensitive material, a photosensitizer and a solvent.

In the aforementioned method, for example, said liquid crystal molecule alignment material accounts for 25~35% by weight of the alignment solution, said photosensitive material accounts for 3.5~6% by weight of the alignment solution, and said photosensitizer accounts for 0.8~2.5% by weight of the alignment solution.

In the aforementioned method, for example, said liquid crystal molecule alignment material is either or both of main chain polyimide and side chain polyimide.

In the aforementioned method, for example, said photosensitive material is 2,3,4,4'-tetrahydroxybenzophenone 1,2-diazidonaphthoquinone-5-sulfonate.

In the aforementioned method, for example, said photosensitizer is diazonaphthalenone sulfonyl chloride.

In the aforementioned method, for example, when said alignment film is removed using the exposure and developing process, the wavelength of the ultraviolet ray emitted from the exposure device is 340~460 nm, and the duration of exposure is 60~100 s.

Another aspect of the present invention further provides a transfer printing plate having a transfer region simultaneously covering the two or more substrates.

Another aspect of the present invention further provides an alignment solution comprising a liquid crystal molecule alignment material, a photosensitive material, a photosensitizer and a solvent. For example, said alignment solution consists of a liquid crystal molecule alignment material, a photosensitive material, a photosensitizer and a solvent.

In the aforementioned alignment solution, for example, said liquid crystal molecule alignment material accounts for 25~35% by weight of the alignment solution, said photosensitive material accounts for 3.5~6% by weight of the alignment solution, and said photosensitizer accounts for 0.8~2.5% by weight of the alignment solution.

In the aforementioned alignment solution, for example, said liquid crystal molecule alignment material is either or both of main chain polyimide and side chain polyimide.

In the aforementioned alignment solution, for example, said photosensitive material is 2,3,4,4'-tetrahydroxybenzophenone 1,2-diazidonaphthoquinone-5-sulfonate.

In the aforementioned alignment solution, for example, said photosensitizer is diazonaphthalenone sulfonyl chloride.

Embodiments of the present invention provide a method for producing a masterboard alignment film, and a transfer printing plate and an alignment solution. The method comprises coating the alignment solution on a masterboard having two or more substrates using the transfer printing plate which has a transfer region simultaneously covering the two or more substrates, so that the alignment solution forms an alignment film on the masterboard; and removing the alignment film on the masterboard which is located in regions that are out of the display regions of the substrates and where there is no need to retain the alignment film. Therefore, it can solve the existing display defect issues that are caused by too thick peripheral regions of the alignment film, and the overlapping of the too thick peripheral regions of the alignment film with the sealant region.

BRIEF DESCRIPTION OF THE DRAWINGS

In order to more clearly illustrate the technical solutions of the embodiments of the present invention, the drawings for the embodiments will be briefly introduced below. Apparently, the drawings in the following description merely relate to some embodiments of the present invention and are not limiting the present invention.

FIG. 4 is a lateral diagrammatic schematic view of the transfer printing plate in the present invention.

FIG. 5 is a planar diagrammatic schematic view of the transfer printing plate in the present invention.

FIG. 6 is a flow chart of the method for producing the masterboard alignment film according to the present invention.

Figure 1:
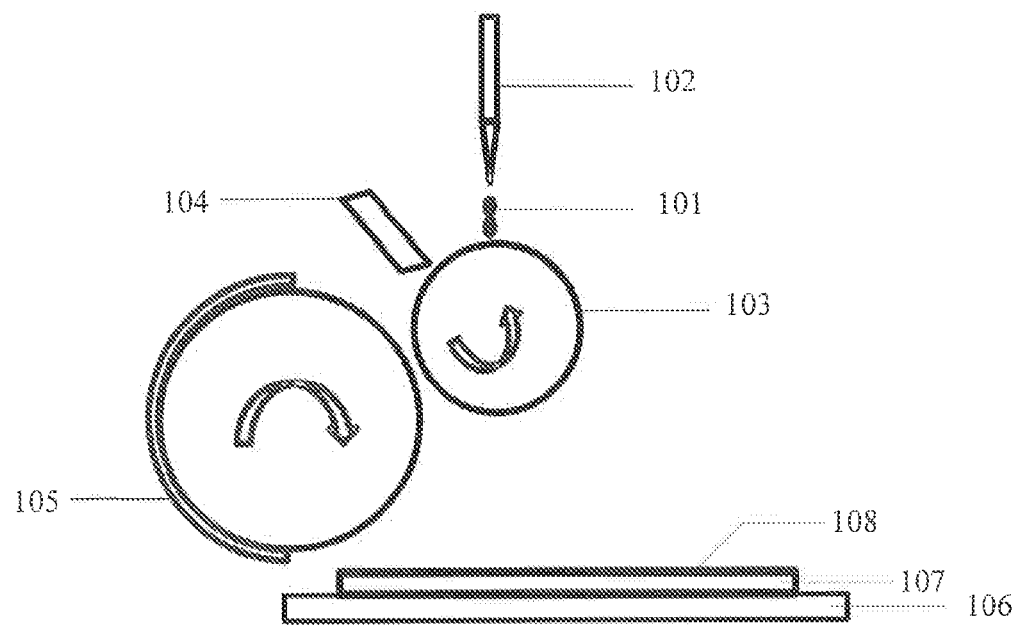
FIG. 1 is a diagrammatic schematic view of the device for coating the alignment agent in the prior art.
Figure 2:
FIG. 2 is a lateral expanded diagrammatic schematic view of the transfer printing plate in the prior art.
Figure 3:
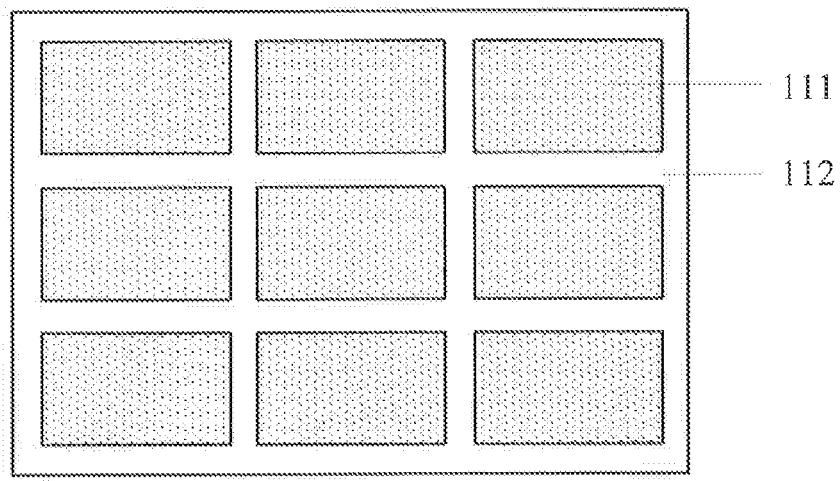
FIG. 3 is a planar diagrammatic schematic view of the transfer printing plate in the prior art.

Description of reference numbers in the drawings:

| | |
|---|---|
| 101: alignment solution | 102: dispenser |
| 103: anilox roll | 104: blade roll |
| 105: transfer printing plate | 106: base |
| 107: masterboard | 108: alignment film |
| 109: basal membrane | 110: transfer layer |

-continued

Description of reference numbers in the drawings:

| | |
|---|---|
| 111: transfer region | 112: non-transfer region |
| 113: display region | 114: nondisplay region |
| 115: assembly seal region | 116: other region |

DETAILED DESCRIPTION

In order to make the object, technical solutions and advantages of the embodiments of the invention more clear, the technical solutions of the embodiments of the present invention are clearly and completely described below in relation to the figures of the embodiments of the present invention. Apparently, the embodiments described are merely some, rather than all embodiments of the present invention. Based on the embodiments of the invention described, any other embodiments obtained by a person of ordinary skill in the art without resorting to creative labor are within the scope of the present invention.

An embodiment of the present invention provides a transfer printing plate. FIGS. 4 and 5 are the lateral and planar diagrammatic schematic views of the transfer printing plate in the present embodiment, respectively. As shown in FIGS. 4 and 5, the transfer printing plate 105 comprises a basal membrane 109 and a transfer layer 110 which has a transfer region 111 that is capable of simultaneously covering the two or more substrates of the masterboard to be coated.

By utilizing the aforementioned transfer printing plate, an embodiment of the present invention further provides a method for producing a masterboard alignment film. FIG. 6 is a flow chart of the method for producing the masterboard alignment film according to the present embodiment. As shown in FIG. 6, this method comprises the following steps.

Step 602: coating an alignment solution on a masterboard having two or more substrates using a transfer printing plate which has a transfer region simultaneously covering the two or more substrates, so that the alignment solution forms an alignment film on the masterboard.

For example, an alignment solution 101 is coated on the masterboard 107 subjected to rinse using the transfer printing plate as shown in FIGS. 4 and 5 of the present invention which has a transfer region simultaneously covering the two or more substrates, so that the alignment solution 101 spreads on the masterboard 107 to form an alignment film 108.

For example, the alignment film consists of a light processing material which can be partially removed by using exposure and developing process. When the alignment film is removed, an exposure process is conducted using a mask plate followed by a developing process.

An example of the alignment solution comprises a liquid crystal molecule alignment material, a photosensitive material, a photosensitizer and a solvent, for example, consists essentially of a liquid crystal molecule alignment material, a photosensitive material, a photosensitizer and a solvent. The aforementioned light processing material can be formed by the curing of the alignment solution.

The above liquid crystal molecule alignment material can account for 25~35% by weight of the alignment solution; the photosensitive material can account for 3.5~6% by weight of the alignment solution; and the photosensitizer can account for 0.8~2.5% by weight of the alignment solution.

An example of the aforementioned liquid crystal molecule alignment material is either or both of main chain polyimide and side chain polyimide.

An example of the photosensitive material is 2,3,4,4'-tetrahydroxybenzophenone 1,2-diazidonaphthoquinone-5-sulfonate.

An example of the photosensitizer can be diazonaphthalenone sulfonyl chloride.

Main chain polyimide may be formed by the polymerization of PMDA and MDA. Side chain polyimide may be formed by the polymerization of PMDA, MDA and TBCA. PMDA is pyromellitic dianhydride; MDA is 4,4'-Methylenedianiline, and TBCA is 4-(4-(trifluoromethoxy)benzoyl)cyclohexyl-3,5-diaminobenzoate.

Figure 7:
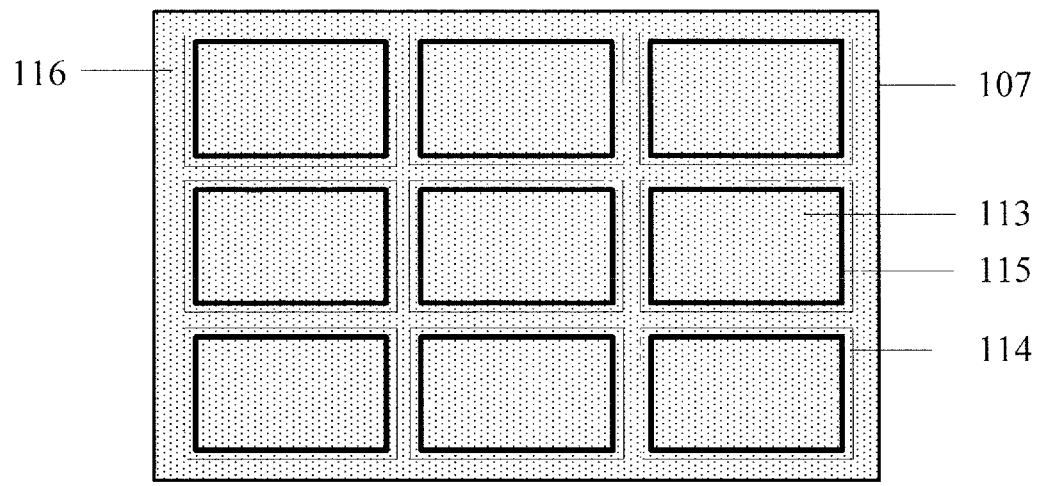
FIG. 7 is a planar diagrammatic schematic view of the masterboard after coating an alignment solution according to the present invention.

FIG. 7 is a planar diagrammatic schematic view of the masterboard after coating an alignment solution according to the present invention. As shown in FIG. 7, the transfer printing plate 105 of the present embodiment as shown in FIGS. 4 and 5, which has the transfer region 111 simultaneously covering the two or more substrates, is used. Therefore, when the transfer printing plate 105 transfers the alignment film 108 onto the two or more substrates of the masterboard 107, the alignment film 108 is formed on the display region 113, the non-display region 114, the assembly seal region 115 of each substrate in the masterboard 107, and formed on other regions 116 in the masterboard 107. The non-display region 114 includes the assembly seal region 115 surrounding the display region 113.

Step 603: removing the alignment film that is located in regions that are out of the display region of the substrates and where there is no need to retain the alignment film on the masterboard.

Figure 8:
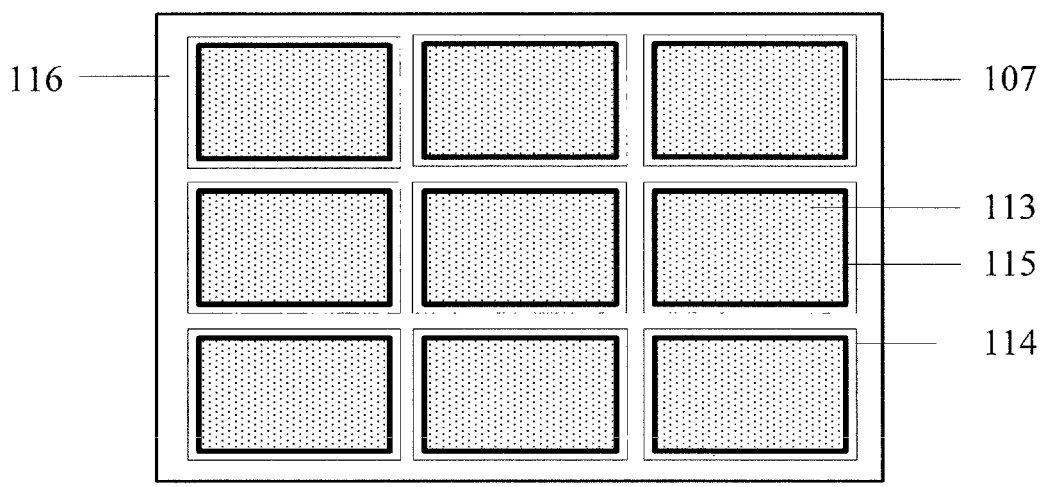
FIG. 8 is a planar diagrammatic schematic view of the masterboard after exposing with a mask plate according to the invention.

For example, on the masterboard 107 formed in Step 602, when using the transfer printing plate 105 as shown in FIGS. 4 and 5 to form the alignment film 108 on the masterboard 107, the non-display regions 114, the assembly seal regions 115 and other regions 116 on the masterboard 107 are also covered by the alignment film 108, and therefore the conductivity between the upper and the lower substrates will be affected. Therefore, in the present step, the display regions 114 or other regions of the masterboard 107 where the alignment film needs to be retained are sheltered with a mask plate, ultraviolet ray is emitted from an exposure device and radiated on the alignment film 108 comprising a photosensitive material on the masterboard 107 through the mask plate, that is, the alignment film 108 on the masterboard 107, which is located in regions that are out of the display region 113 of each substrate and where there is no need to retain the alignment film, is removed by exposure and developing process. Here, the alignment film 108 on the masterboard 107, which is located in regions that are out of the display region 113 of each substrate and where there is no need to retain the alignment film, can also be removed by way of photolithograph method, etc., to obtain the masterboard 107 as shown in FIG. 8.

For example, the wavelength of the ultraviolet ray emitted from the exposure device can be 340~460 nm, and the duration of exposure lasts 60~100 s.

This masterboard 107 is used, e.g., for preparing an array substrate or a color filter substrate. After the formation of the alignment film, the alignment film is subjected to a rubbing process so as to form microscopic grooves arranged in the alignment film along a certain direction. For the array substrate and the color filter substrate, the direction of rubbing may be identical to or different from each other. Subsequently, the masterboard is cut to obtain individual array substrates or color filter substrates.

In the method for producing a masterboard alignment film and the transfer printing plate provided in the embodiments of the present invention, by improvement and modification upon the existing transfer printing plate, when the alignment film is transferred onto the substrates on the masterboard, the evenness of the alignment solution coated on the substrates is better and an alignment film with a consistent thickness is more easier to form than using the existing transfer printing plate that has both an effective region and a non-effective region. Here, even if more alignment solutions exist in the peripheral region outside the display region, or even if deviational printing of the alignment film occurs, the excessive alignment film can be removed by the exposure and developing process or the photolithography process, thereby solving the existing display defect issues that are caused by too thick peripheral regions of the alignment film, and overlapping of the too thick peripheral regions of the alignment film with the sealant region. Moreover, there is no need to produce transfer printing plates corresponding to different models of substrates. As long as the sizes of the substrates on the masterboard 107 are the same, the same transfer printing plate can be used.

The aforementioned are merely preferred embodiments of the present invention and are not limiting the scope of the present invention. Any modification, equivalent substitution and improvement within the spirits and principles of the present invention shall be encompassed in the scope of the present invention.

The invention claimed is:

1. A method for producing a masterboard alignment film comprising:

coating an alignment solution on a masterboard having two or more substrates using a transfer printing plate which has a transfer region simultaneously covering the two or more substrates, so that the alignment solution forms an alignment film on the masterboard; and removing the alignment film on the masterboard which is located in regions that are out of display regions of the substrates and where there is no need to retain the alignment film;

wherein the alignment film is formed of a light processing material comprising a liquid crystal molecule alignment material, a photosensitive material, a photosensitizer and a solvent; and an exposure process is conducted on the alignment film itself using a mask plate with a duration of exposure being between 60 seconds and 100 seconds so as to make a predetermined region of the alignment film exposed, and then a developing process is conducted on the alignment film itself for removing the alignment film in regions that are out of display regions of the substrates and where there is no need to retain the alignment film;

wherein the transfer printing plate is provided around an outer surface of a roll, and the transfer printing plate comprises a basal membrane and a transfer layer that is smaller than the basal membrane and disposed on the basal membrane, and in operation the transfer layer simultaneously contacts the two or more substrates of the masterboard to simultaneously transfer the alignment solution onto the two or more substrates of the masterboard.

2. The method according to claim 1, wherein said liquid crystal molecule alignment material is either or both of main chain polyimide and side chain polyimide.

3. The method according to claim 1, wherein said photosensitive material is 2,3,4,4'-tetrahydroxybenzophenone 1,2-diazidonaphthoquinone-5-sulfonate.

4. The method according to claim 1, wherein said photosensitizer is diazonaphthalenone sulfonyl chloride.

5. The method according to claim 1, wherein when said alignment film is removed using the exposure and developing process, an wavelength of an ultraviolet ray emitted from an exposure device is 340~460 nm.

6. The method according to claim 1, wherein said liquid crystal molecule alignment material accounts for 25~35% by weight of the alignment solution, said photosensitive material accounts for 3.5~6% by weight of the alignment solution, and said photosensitizer accounts for 0.8~2.5% by weight of the alignment solution.

* * * * *